(12) United States Patent
Yin Pang et al.

(10) Patent No.: US 6,909,169 B2
(45) Date of Patent: Jun. 21, 2005

(54) GROUNDED EMBEDDED FLIP CHIP RF INTEGRATED CIRCUIT

(75) Inventors: Hawk Yin Pang, Tokyo (JP); Kenichi Hashizume, Gunma (JP)

(73) Assignee: Nokia Corporation, Espoo (FI)

( * ) Notice: Subject to any disclaimer, the term of this patent is extended or adjusted under 35 U.S.C. 154(b) by 108 days.

(21) Appl. No.: 10/325,056

(22) Filed: Dec. 20, 2002

(65) Prior Publication Data

US 2004/0119149 A1 Jun. 24, 2004

(51) Int. Cl.$^7$ .............................................. H01L 23/495
(52) U.S. Cl. ................. 257/675; 257/678; 257/706; 257/707; 257/717; 257/719; 257/720
(58) Field of Search .................. 257/675, 678, 257/706, 707, 717, 719, 720

(56) References Cited

U.S. PATENT DOCUMENTS 5,909,057 A * 6/1999 McCormick et al. ....... 257/704

* cited by examiner

*Primary Examiner*—Thien F Tran
(74) *Attorney, Agent, or Firm*—Harrington & Smith, LLP

(57) ABSTRACT

A system for packaging an integrated circuit amplifier bonds the integrated circuit to metallization lines in a substrate surface with solder balls, the contacts of the integrated circuit being on a top surface and the opposite surface of the integrated circuit being adjacent to a set of vias for conducting heat away from the circuit into the ambient; the material for the material disposed about the integrated circuit being deposited in powder form and later solidified.

24 Claims, 4 Drawing Sheets

GROUNDED EMBEDDED FLIP CHIP RF INTEGRATED CIRCUIT

TECHNICAL FIELD

The field of the invention is packaging RF integrated circuits, in particular reducing losses in operation and increasing bandwidth performance, while simultaneously improving the transport of heat away from the integrated circuit.

BACKGROUND OF THE INVENTION

Conventional chips, as illustrated in FIG. 3, have their ground planes located at the bottom of the chip (opposite the contact pads) and the pads on the chip are located at the top of the chip. FIG. 3 illustrates an approach in the prior art, in which chip 100 rests on substrate 120 that, in turn, may be attached to a printed circuit board. Electrical connections for signals are made by wire bonding wires 115 from contacts on the top surface of the chip in the figure to pads on substrate 120. Surface 103, opposite to the contacts is the ground plane and is in thermal contact with substrate 120.

Generally when power amplifier integrated circuits are designed using a substrate carrier for the power amplifier integrated circuit, the substrate includes many via holes (thermal via holes) 140 located in the area where the power amplifier integrated circuit is to be mounted. These holes are placed to conduct heat away from the power amplifier integrated circuit and into the ambient. At higher frequencies (e.g. >2 GHz), the length of the via holes also plays an important role, since the via holes can create parasitic inductance in addition to the inductance created by the bondwires, thereby affecting the circuit's performance.

In addition, at these high frequencies, the bandwidth of the signal can be significantly reduced due to the parasitic inductance created by the bondwires at these frequencies. Further, the bondwires at DC voltage exhibit low resistance, thus reducing the power efficiency of a power amplifier integrated circuit.

Another problem with present technology is the bondwire bonding machinery. When bonding bondwires, the tolerance error for the length of the bondwires could be as much as 30%; i.e. the actual path 115 in FIG. 3 can be 30% greater than the direct path 116. Arrow 117 indicates a typical extra vertical dimension. Hence, at higher frequencies, it is more difficult for designers to design circuitry so that this 30% can be compensated.

SUMMARY OF THE INVENTION

The invention relates to embedded RF power amplifier integrated circuits in ceramic material implementing grounded via holes for the integrated circuit.

A feature of the invention is the elimination of bondwires, allowing the reduction of losses.

Another feature of the invention is increasing the bandwidth performance of the circuit at higher frequencies.

Another feature of the invention is the provision of a number of small vias for passage of heat into the ambient.

Yet another feature of the invention is the use of a large via comparable in size to the integrated circuit for thermal management.

BEST MODE OF CARRYING OUT THE INVENTION

Figure 1:
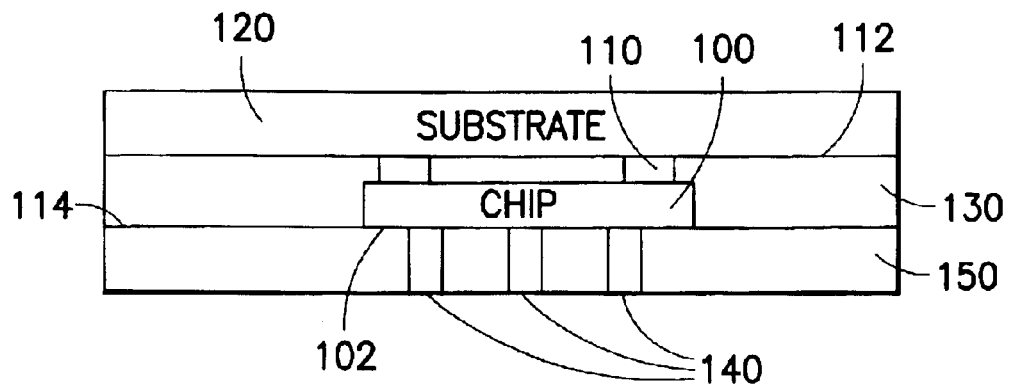
FIG. 1 shows in cross section a first embodiment of the invention.

FIG. 1 shows in cross section an integrated circuit 100, illustratively a power amplifier integrated circuit (IC), that is placed between two layers of substrate. On the top in the Figure, substrate 120 has a layer of metallization traces 112 on the lower side (in the Figure) some of which are bonded to integrated circuit 100. Other portions of the metallization layer will form passive components and contact other integrated circuits not shown in this figure.

At the lower portion of the figure, another substrate 150 supports integrated circuit 100 and also supports another metallization layer 114, which may be formed on the bottom of intermediate layer 130.

At the center of substrate 150, a set of via holes 140 permit the easy passage of heat from integrated circuit 100 into the ambient. The process of forming this structure will be discussed further below.

It is an advantageous feature of the invention that the connections 110 between integrated circuit 100 and metallization 112 are formed by solder balls, as is known in the art. Such an attachment method reduces the problems with variable amounts of inductance that were discussed above as being associated with the wire bonding technique.

Lower surface 102 of integrated circuit 100 is conventionally used as the ground of the integrated circuit. One of the components of metallization 114 may be used to connect that ground to a circuit ground. If a power amplifier integrated circuit has its ground on the same surface as the contacts 110, the ground contact may be made through metallization 112.

A preferred method of construction is illustrated with reference to FIG. 4, in which system 400 is a micro construction system that has the capability of building up structures in a flexible manner.

The workpiece, e.g. chip 100 bonded to upper substrate 120 is mounted on substrate holder 410. Holder 410 is moved by precision X-Y-Z-theta stage 430 as required to bring mask 420 and integrated circuit 100 in alignment with nozzle 425. Nozzle 425 emits a stream of fine powder particles that will be sintered or otherwise bonded together to form substrate 150 and optionally intermediate layer 130. The carrier gas and powder particles travel through a space in vacuum chamber 402, maintained at a low pressure by vacuum pump 405.

The power particles are fed to nozzle 425 through pipe 427 containing a carrier gas loaded with powder particles of powder 440. The carrier gas comes from source 460 that passes through powder reserve 435 where it picks up a quantity of powder that is delivered precisely to locations in the structure. By moving the substrate and/or the mask, a desired structure may be built up from the powder and then solidified, e.g. by sintering.

Optionally, intermediate layer 130 may be built up from the powder, or it may be a prefabricated layer having an aperture for integrated circuit 100. If the layer 130 is built up, the system in FIG. 4 may have an additional source of conductive (e.g. metallic) powder that will form metallization layer 114, or a metallization mask could be manufactured where this allows the use of standard printing technology.

Figure 4:
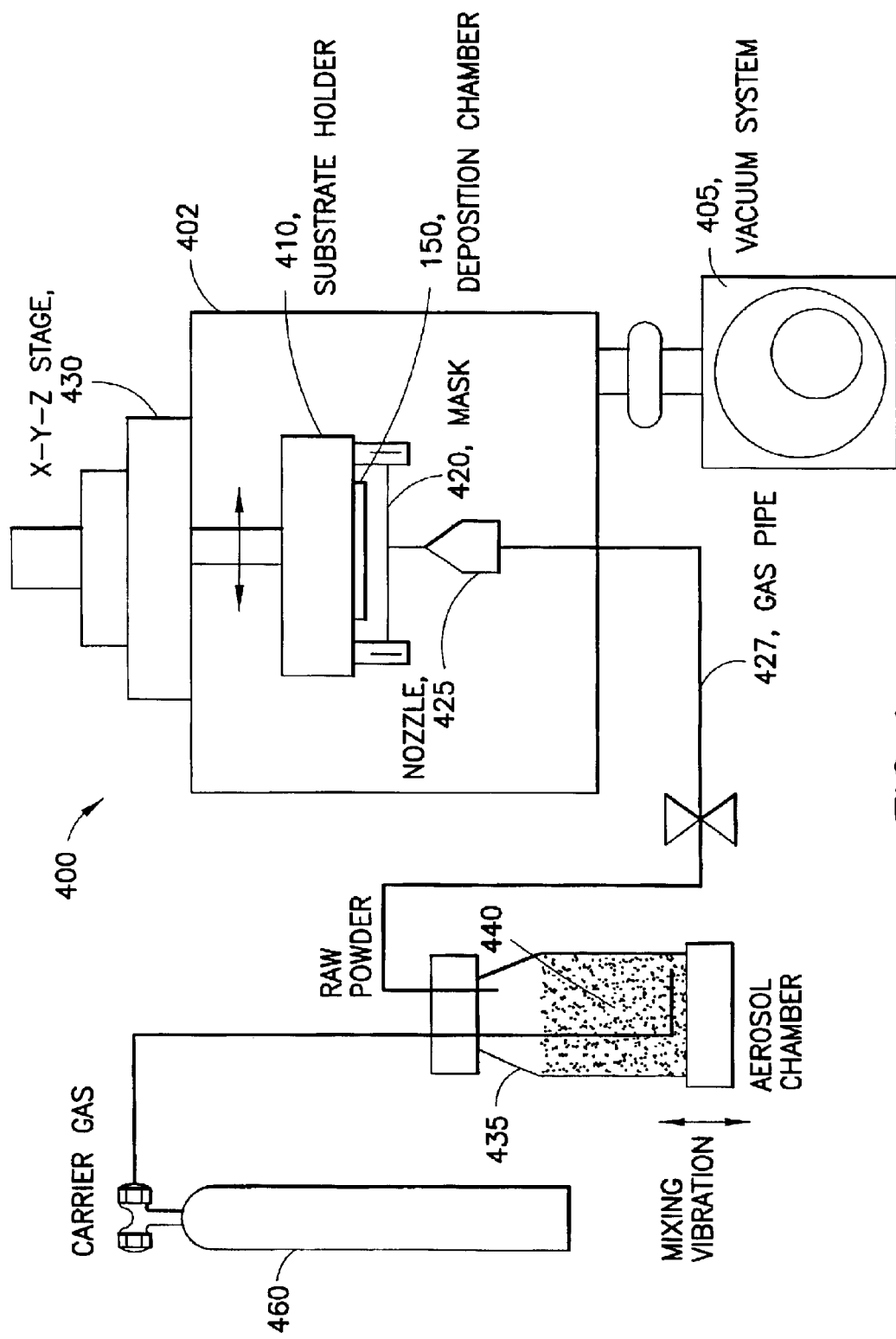
FIG. 4 shows schematically a system for applying material to the integrated circuit for use with the invention.

In addition to forming the lower substrate 150, the system of FIG. 4 can also form vias 140 by appropriately shaping the material of substrate 150 to leave openings 140. This can be done by using the mask feature of mask 420 to block the flow of particles at the right places where vias are to be formed. Optionally, the openings may be left open, so that heat may escape through the openings, or a metallization mask could be manufactured where this allows the use of standard printing technology. Alternatively, a material having good thermal conductivity such as aluminum, copper or other metal, referred to as a heat transfer member, may be deposited either in a via that has been formed previously, or simultaneously with the formation of substrate 150 by supplying a second nozzle, gas and powder supply.

Figure 2:
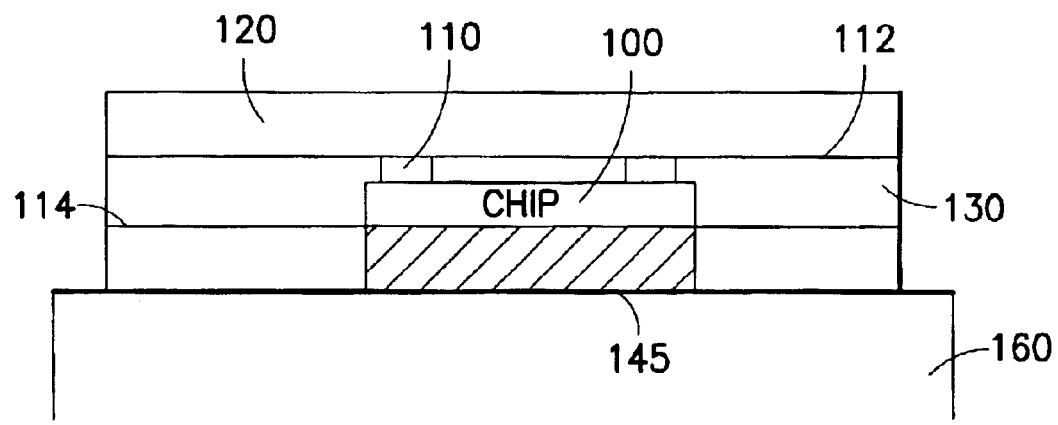
FIG. 2 shows in cross section a second embodiment of the invention.
Figure 3:
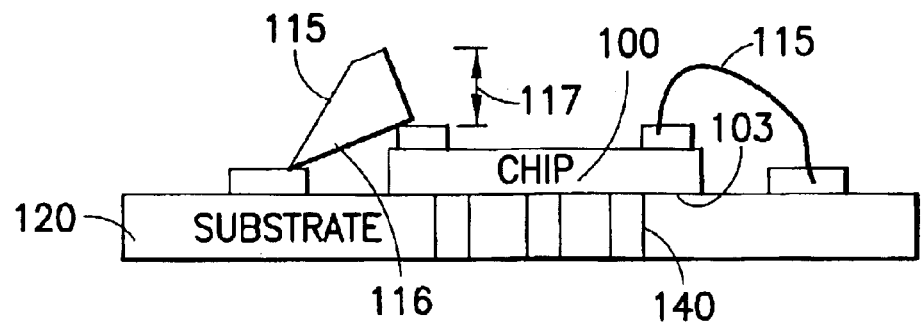
FIG. 3 shows in cross section a structure from the prior art.

As a variation of the preceding version of the invention, a single large heat transfer member 145 may be formed as shown in FIG. 2. This member may also be alternatively formed by fabricating substrate 150 with a large aperture and then filling that aperture with the thermally conductive material, such as aluminum, copper or other metal.

An advantageous feature of the invention is that the use of wider solder balls in place of thin wires in a wire-bond setup provides a wider frequency bandwidth, lower losses and simultaneously improving the removal of heat by use of thermal via holes or heat-conductive pathways. In the prior art, for example, it was necessary to design an amplifier or other circuit for a particular narrow frequency range (e.g. 5.17 GHz to 5.2 GHz) because of the limitations of the bandwidth of interconnect circuits caused by the use of bondwires. In contrast, the wider bandwidth of the interconnections according to the invention (e.g. solder balls) permit the use of integrated circuits with a much wider bandwidth (e.g. 5–6 Ghz) and simultaneously allows thermal grounding of power amplifier integrated circuits. This, in turn, permits reduction in the amount of parts that must be made available, since one wide-band model of circuit can substitute for a number of narrow-band models that were required for prior art interconnects.

Those skilled in the art will appreciate that substrate 150 may be pre-formed with metallization 114 on its surface and with vias 140 and/or 145 formed in it. These vias are filled with a thermally conductive material either before integrated circuit 100 is attached, or after.

FIG. 5 summarizes a sequence of forming a structure according to the invention. Referring now to FIG. 5A, there is shown a perspective view of a substrate 120 with a metallization pattern 112 formed on it. Substrate 120 may be formed from a ceramic, such as $Al_2O_3$, or an organic substance that will withstand the temperature requirements of forming the metallization pattern.

Figure 5A:
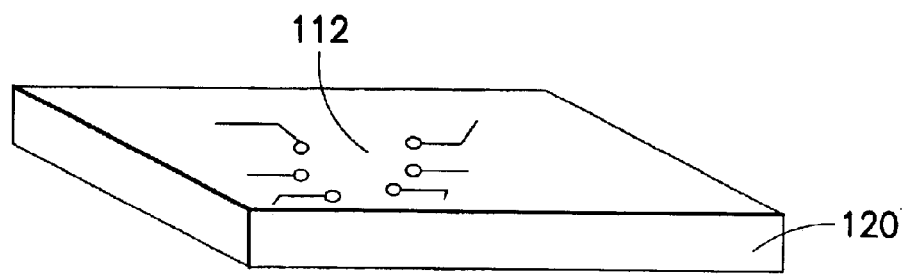
FIGS. 5A–5E, collectively referred to as FIG. 5, show a sequence of processing steps for forming a structure in accordance with this invention.
Figure 5B:
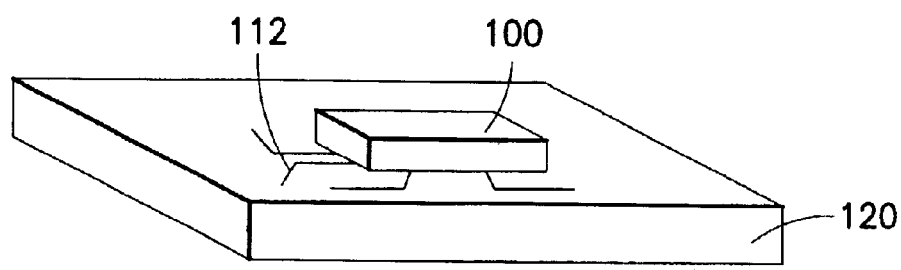

FIG. 5B shows the same view, after an integrated circuit 100 has been bonded to the metallization pattern 112, e.g., by solder ball bonding.

Figure 5C:
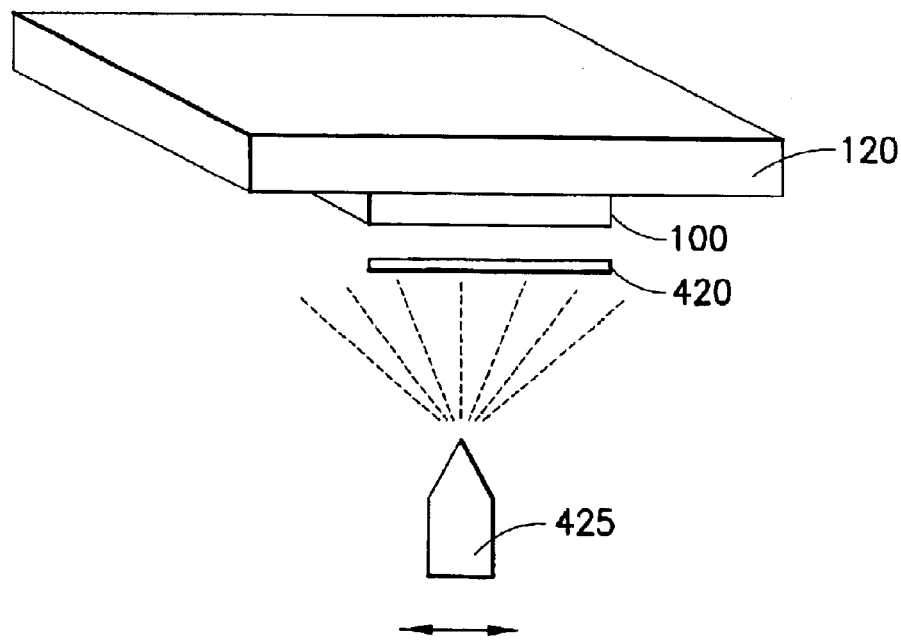
Figure 5D:
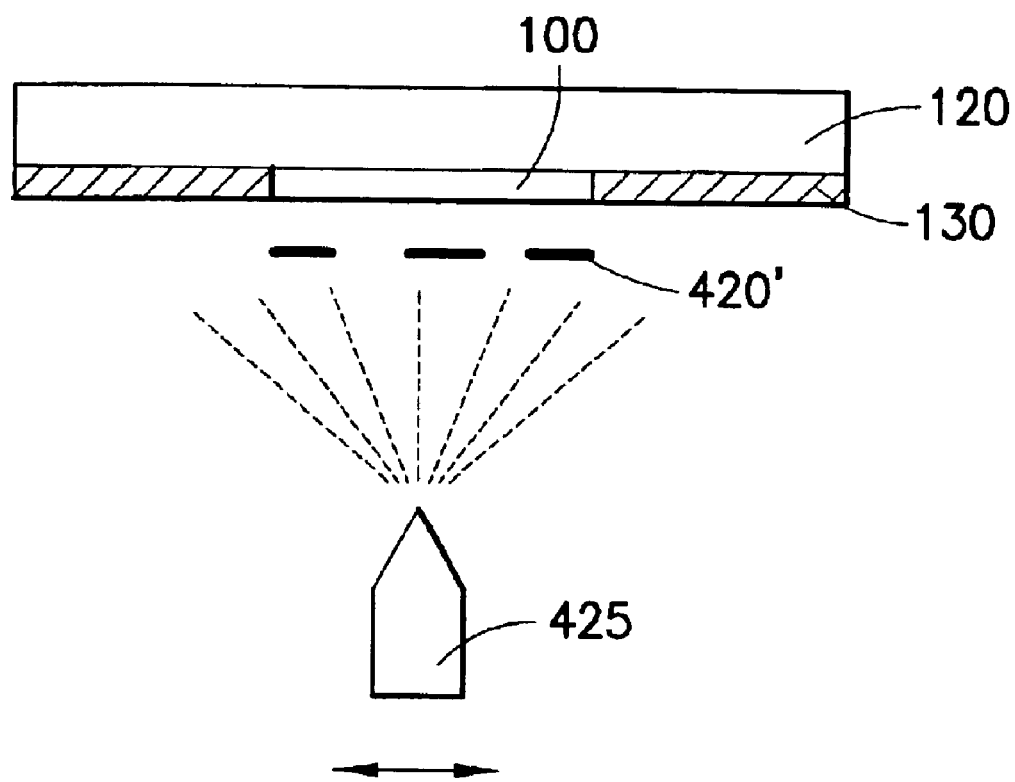

FIG. 5C shows the substrate plus chip from FIG. 5B, with the substrate rotated vertically, so that chip 100 is now on the bottom. A powder is shown as being sprayed around chip 100, which is blocked by mask 420. The powder then builds up about the chip, filling in the space surrounding the chip with layer 130 (FIG. 5D). The horizontal arrow at the bottom of the Figure indicates that the substrate and/or the chip may move transversely to provide more uniform coverage.

FIG. 5D now shows the assemblage after the second level 130 has been completed, filling in the space to the level of the surface of chip 100 that is opposite to substrate 120. Another mask 420' has been placed between the chip 100 and the nozzle 425 to define a set of vias, shown later. This third layer will both provide protection to chip 100 and also provide a thermal pathway for heat from the chip to flow into the ambient.

Figure 5E:
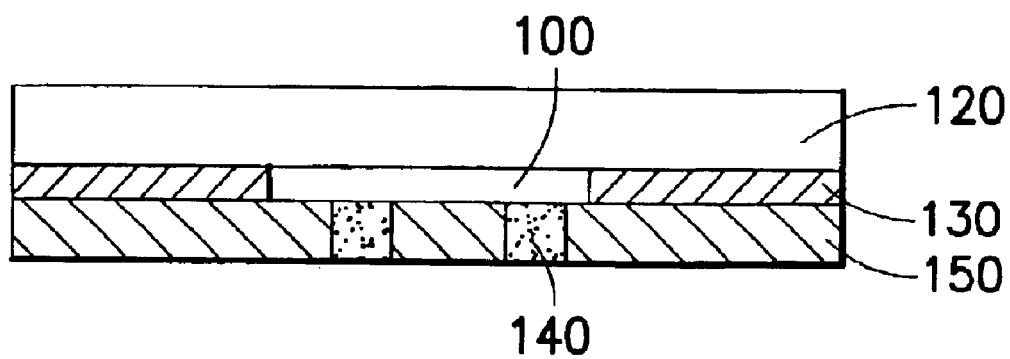

FIG. 5E shows the completed assemblage, in which the third layer 150 has been finished and covers the second layer 130, plus the chip 100. A set of vias, indicated schematically by two rectangles labeled 140 are illustratively copper blocks that have been formed by inserting a paste containing copper into the vias formed in the preceding step. During the sintering (or thermal bonding) step that binds the material of the second and third layers, the metal paste material forming blocks 140 will also be bonded.

The powder spraying technique illustrated may be replaced by a technique of screen printing, in which mask 420 of FIG. 5C represents the solid part of a screen that permits the passage of a paste through it to fill the area outside the chip 100. Similarly, the mask 420' in FIG. 5D may represent a solid portion of a screen with a set of apertures that permit the passage of the paste outside the via areas, so that the third layers contains apertures that are filled in a subsequent filling step, with a thermally conductive material (e.g. copper), to form the conductive members 140 of FIG. 5E.

While the invention has been described in terms of a single preferred embodiment, those skilled in the art will recognize that the invention can be practiced in various versions within the spirit and scope of the following claims.

What is claimed is:

1. An assemblage for an integrated circuit comprising:
    a substrate having a set of interconnect members on a first surface thereof;
    an integrated circuit having integrated circuit contacts bonded to substrate contacts within said set of interconnect members by solder;
    an intermediate layer adjacent to said first surface of said substrate and enclosing said integrated circuit;
    a third layer adjacent to a second surface of said intermediate layer and having a thermal region adjacent to a back surface of said integrated circuit opposite to said integrated circuit contacts, said thermal region having at least one solid, thermally conductive heat transfer member extending through said third layer.

2. An assemblage according to claim 1, in which said integrated circuit is an RF amplifier and said integrated circuit contacts are adapted to pass signals in a bandwidth of at least one gigahertz.

3. An assemblage according to claim 2, in which said integrated circuit is a broadband RF amplifier.

4. An assemblage according to claim 1, further comprising a set of at least one via through said thermal region of said third layer.

5. An assemblage according to claim 4, in which said integrated circuit is an RF amplifier.

6. An assemblage according to claim 5, in which said integrated circuit is a broadband RF amplifier.

7. An assemblage according to claim 4, wherein said thermally conductive heat transfer member is disposed within said at least one via.

8. An assemblage according to claim 7, in which said integrated circuit is an RF amplifier.

9. An assemblage according to claim 8, in which said integrated circuit is a broadband RF amplifier.

10. An assemblage according to claim 4, in which said set of at least one via through said thermal region of said third layer comprises at least two vias.

11. An assemblage according to claim 10, in which said integrated circuit is an RF amplifier.

12. An assemblage according to claim 11, in which said integrated circuit is a broadband RF amplifier.

13. An assemblage according to claim 1, further comprising a single via through said thermal region of said third layer.

14. An assemblage according to claim 13, in which said integrated circuit is an RF amplifier.

15. An assemblage according to claim 14, in which said integrated circuit is a broadband RF amplifier.

16. An assemblage according to claim 13, further comprising a thermally conductive member disposed within said single via.

17. An assemblage according to claim 16, in which said integrated circuit is a RF amplifier.

18. An assemblage according to claim 17, in which said integrated circuit is a broadband RF amplifier.

19. An assemblage for an integrated circuit comprising:
   a first layer having a set of interconnect members on a first surface thereof;
   an integrated circuit having integrated circuit contacts bonded to substrate contacts within said set of interconnect members by solder;
   a second layer adjacent to said first surface of said first layer, formed enclosing said integrated circuit and having a thermal region adjacent to a back surface of said integrated circuit opposite to said integrated circuit contacts, said thermal region having at least one solid, thermally conductive heat transfer member extending through said third layer.

20. An assemblage according to claim 19, in which said second layer is formed by deposition and binding of a powder.

21. An assemblage according to claim 19, in which said second layer is formed by spraying a powder selectively about said integrated circuit in a transverse dimension and over said back surface, forming a set of vias in said thermal region.

22. An assemblage according to claim 19, in which said second layer is formed by spraying said powder selectively about said integrated circuit in a transverse dimension and over said back surface, forming a single via in said thermal region.

23. An assemblage according to claim 19, in which said second layer is formed by applying paste by screen printing techniques about said integrated circuit.

24. An assemblage according to claim 23, in which said second layer is formed by applying a paste by screen printing techniques to produce a set of vias in said thermal region.

* * * * *